(12) United States Patent
Kimura

(10) Patent No.: US 7,030,505 B2
(45) Date of Patent: Apr. 18, 2006

(54) RESIN-SEALED-TYPE SEMICONDUCTOR DEVICE, AND PRODUCTION PROCESS FOR PRODUCING SUCH SEMICONDUCTOR DEVICE

(75) Inventor: Naoto Kimura, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/701,619

(22) Filed: Nov. 6, 2003

(65) Prior Publication Data

US 2004/0099933 A1    May 27, 2004

(30) Foreign Application Priority Data

Nov. 25, 2002  (JP) .............................. 2002-341291

(51) Int. Cl.
*H01L 23/28* (2006.01)
(52) U.S. Cl. .................. 257/796; 257/787; 257/675; 257/706; 257/707; 438/122; 438/123; 438/124; 438/126
(58) Field of Classification Search ........ 257/706–707, 257/675, 787, 796, 678, 666, 782–784, 719; 438/111–112, 122–127
See application file for complete search history.

(56) References Cited

U.S. PATENT DOCUMENTS

| | | | | |
|---|---|---|---|---|
| 5,327,008 A * | 7/1994 | Djennas et al. | ............. | 257/666 |
| 5,387,554 A * | 2/1995 | Liang | ............. | 29/827 |
| 5,397,915 A * | 3/1995 | Nose | ............. | 257/676 |
| 5,644,164 A | 7/1997 | Roh | | |
| 5,683,944 A * | 11/1997 | Joiner et al. | ............. | 438/122 |
| 5,783,860 A * | 7/1998 | Jeng et al. | ............. | 257/675 |
| 5,864,174 A * | 1/1999 | Yamada et al. | ............. | 257/676 |
| 6,177,725 B1 * | 1/2001 | Yamada et al. | ............. | 257/704 |
| 6,197,615 B1 * | 3/2001 | Song et al. | ............. | 438/111 |
| 6,239,487 B1 * | 5/2001 | Park et al. | ............. | 257/712 |
| 6,258,630 B1 * | 7/2001 | Kawahara | ............. | 438/122 |
| 6,291,273 B1 * | 9/2001 | Miyaki et al. | ............. | 438/123 |
| 6,306,684 B1 * | 10/2001 | Richardson et al. | ......... | 438/118 |
| 6,516,994 B1 * | 2/2003 | Takahashi | ............. | 228/180.5 |
| 2001/0040300 A1 * | 11/2001 | Huang et al. | ............. | 257/787 |
| 2003/0015775 A1 * | 1/2003 | Minamio et al. | ............. | 257/676 |

FOREIGN PATENT DOCUMENTS

| | | |
|---|---|---|
| JP | 2000-294712 A | 10/2000 |
| JP | 2001-156235 A | 6/2001 |
| KR | 2000-0071330 A | 11/2000 |

\* cited by examiner

*Primary Examiner*—Amir Zarabian
*Assistant Examiner*—Thanh Y. Tran
(74) *Attorney, Agent, or Firm*—Sughrue Mion, PLLC

(57) ABSTRACT

A resin-sealed type semiconductor device has a mount stage, a semiconductor chip mounted on the stage such that a rear surface of the chip is in contact with the stage, a heat spreader associated with the stage and the chip, and a molded resin package encapsulating the stage, chip, and heat spreader. The stage is configured such that the rear surface of the chip is partially covered with the stage, whereby uncovered areas are defined on the rear surface of the electronic component. The heat spreader is complementarily configured with respect to the stage so as to be in direct contact with the uncovered areas of the rear surface of the electronic component, whereby an entire thickness of both the mount stage and the heat spreader is smaller than a total of a thickness of the mount stage and a thickness of the heat spreader.

34 Claims, 14 Drawing Sheets

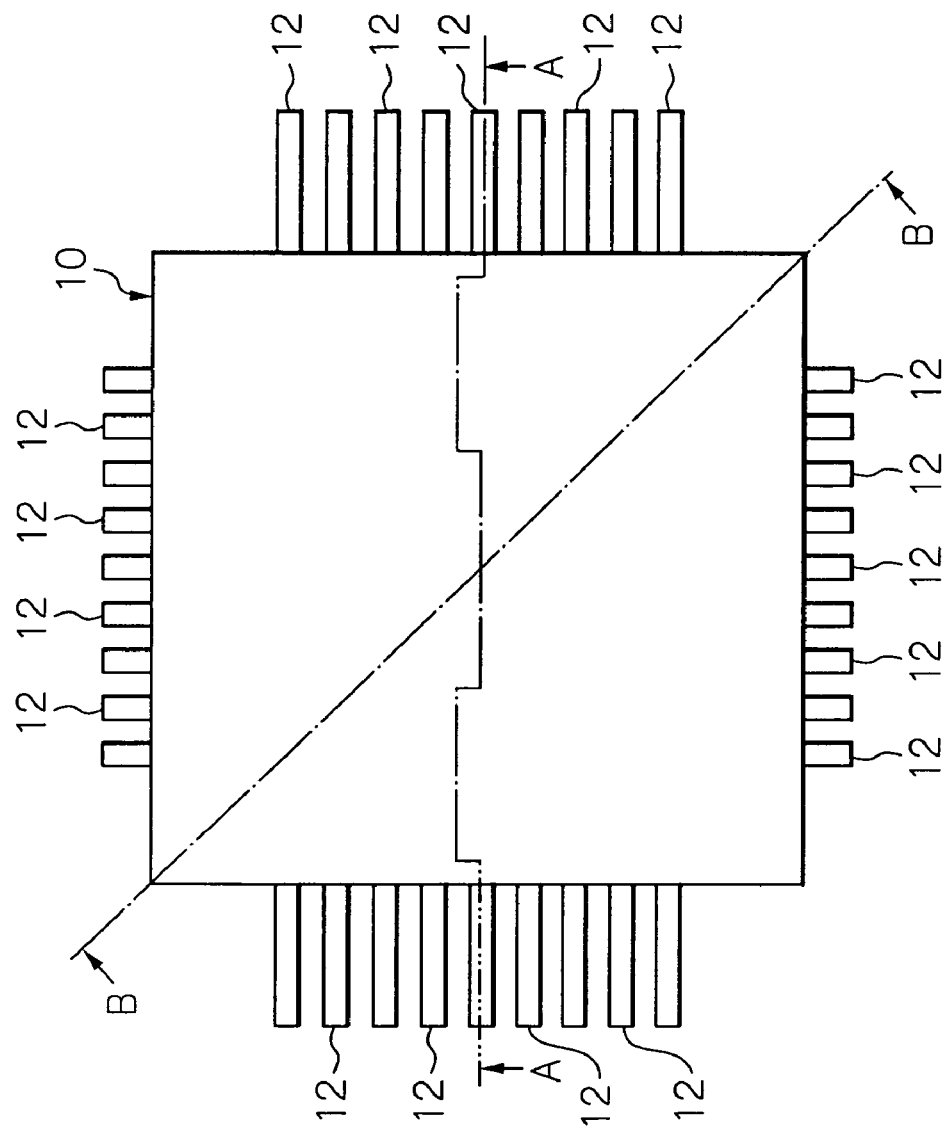

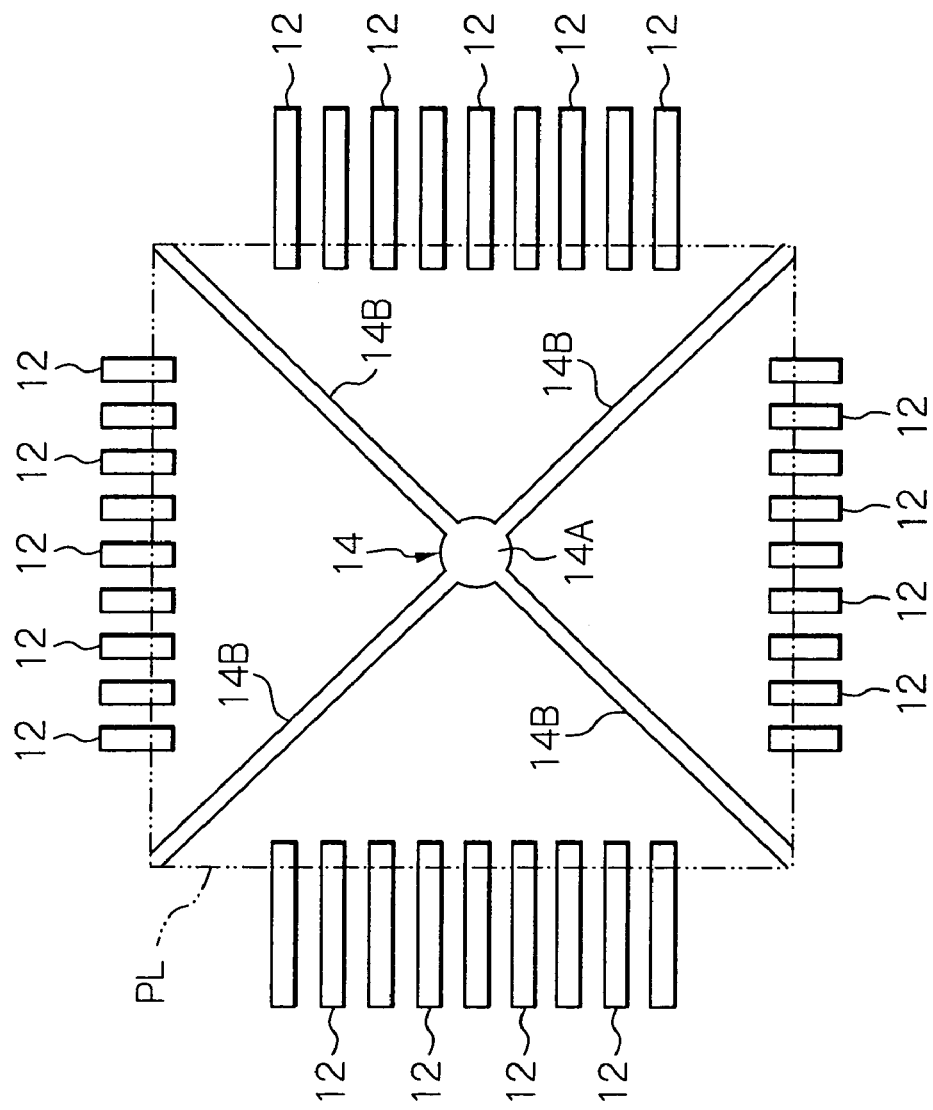

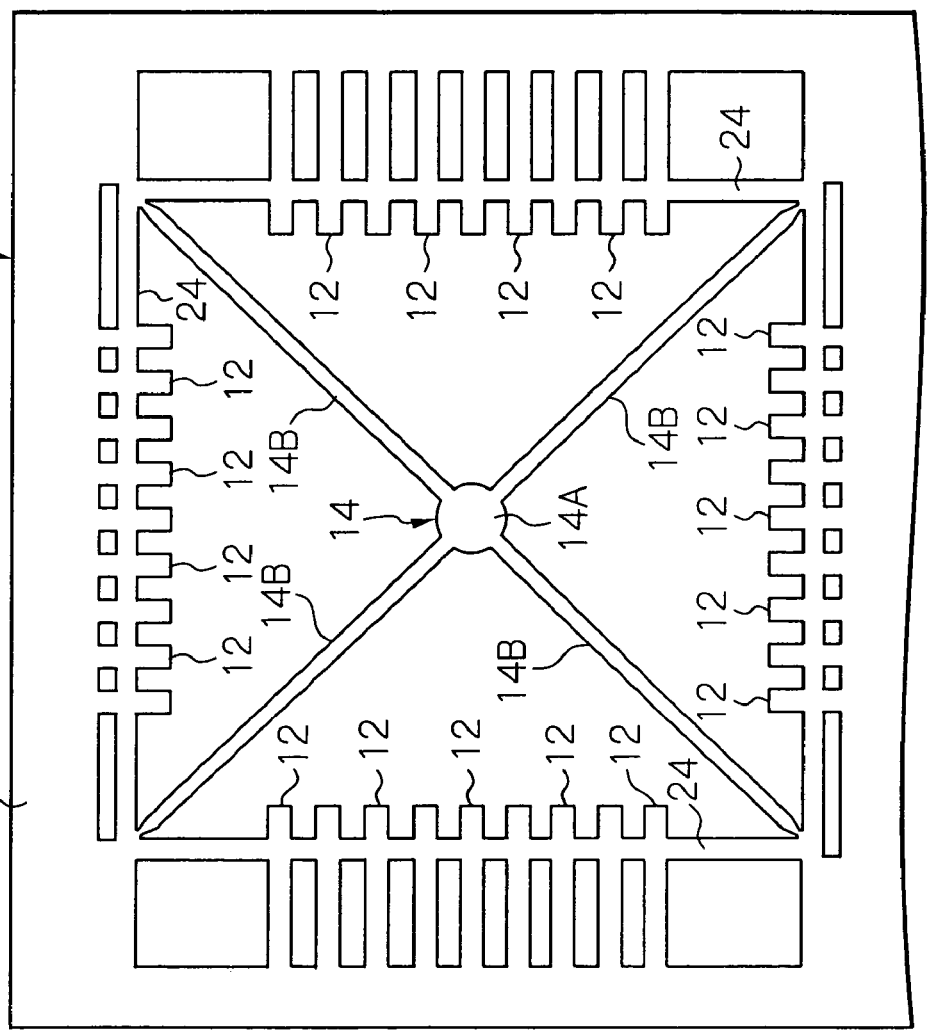

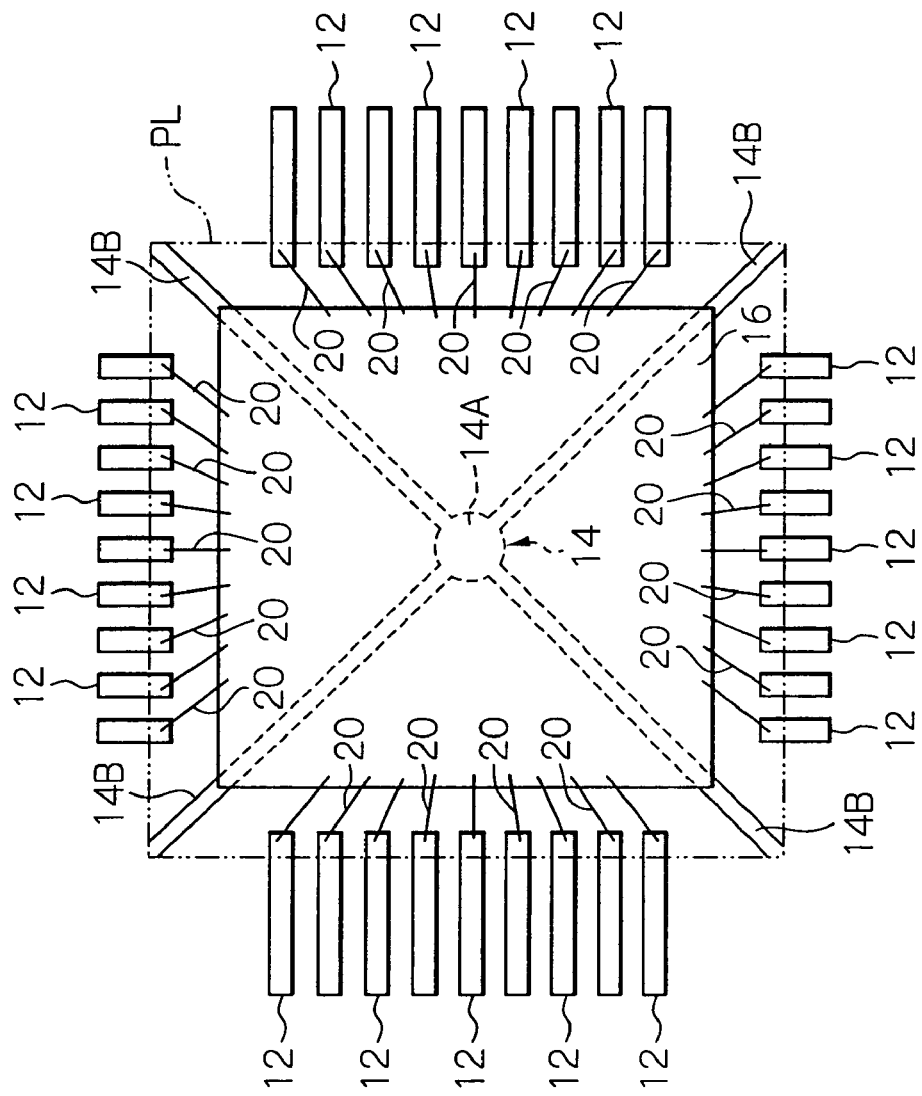

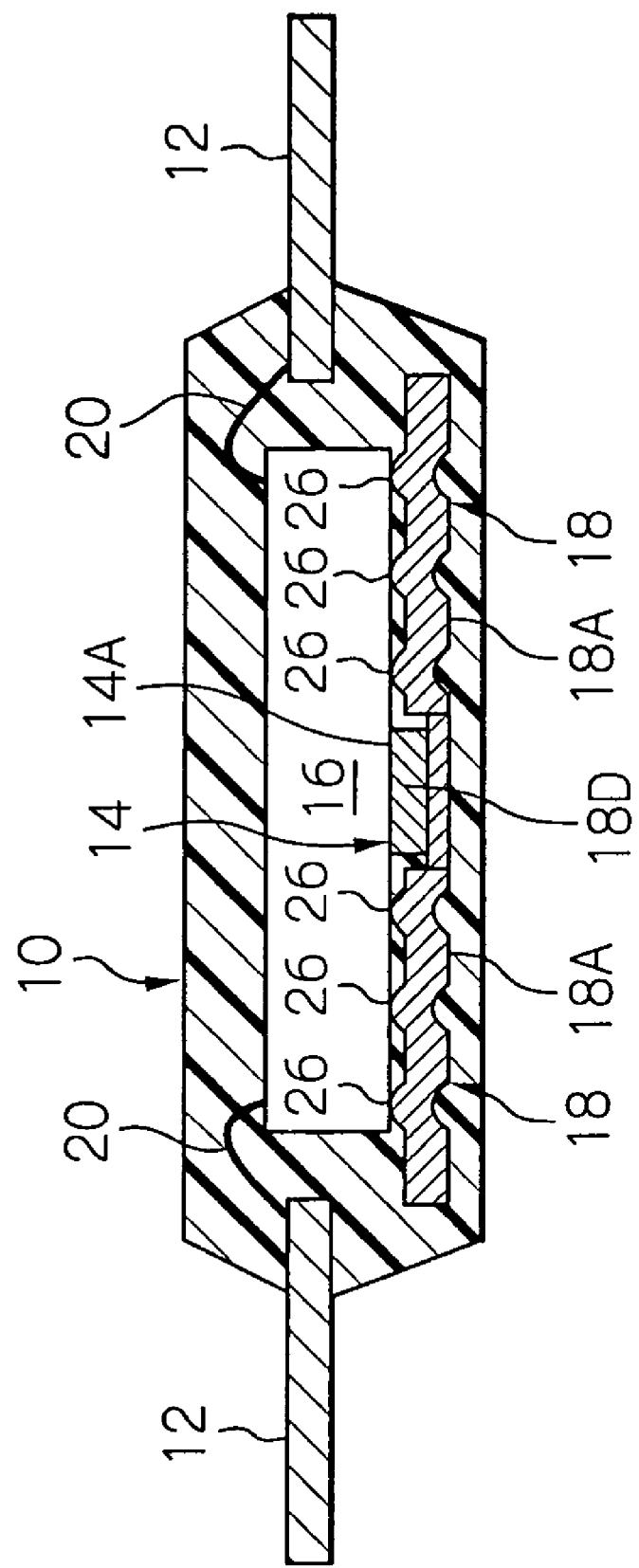

RESIN-SEALED-TYPE SEMICONDUCTOR DEVICE, AND PRODUCTION PROCESS FOR PRODUCING SUCH SEMICONDUCTOR DEVICE

BACKGROUND OF THE INVENTION

1. Field of the Invention

The present invention relates to a resin-sealed type semiconductor device having an electronic component encapsulated in a molded resin package, and a heat spreader incorporated in the molded resin package to facilitate radiation of heat from the electronic component, and also relates to a production method for manufacturing such a resin-sealed type semiconductor device.

2. Description of the Related Art

In general, a resin-sealed type semiconductor device is produced by using a lead frame including a mount stage and a plurality of leads. In particular, first, an electronic component, such as a semiconductor chip, is mounted on the mount stage, and then the respective leads are electrically connected at their inner ends to terminal pads formed and arranged on the electronic component through bonding wires. Subsequently, the electronic component is placed together with the mount stage in a molding cavity defined by a metal mold, such that the leads extend outward through the metal mold. Thereafter, a suitable resin material is injected into the molding cavity, whereby the electronic component, the mount stage, and the inner lead sections of the leads are enclosed with and encapsulated in the molded resin package, with outer lead sections of the leads being protruded from the molded resin package, resulting in the production of the resin-sealed type semiconductor device.

When the electronic component generates a large amount of heat in operation, a heat spreader is incorporated and buried in the molded resin package, to thereby facilitate radiation of heat from the electronic component, as disclosed in, for example, Japanese Laid-Open Patent Publications (KOKAI) No. 2000-294712 and No. 2001-156235. In particular, the heat spreader is made as a suitable metal sheet, such as a copper sheet, a copper alloy sheet or the like, having a thickness of 100 to 250 µm, and is formed with a plurality of protrusions or ribs. The heat spreader is associated with the mount stage such that the protrusions or ribs are in contact with the rear face of the mount stage, so that the heat is transmitted from the electronic component to the heat spreader through the intermediary of the mount stage.

Of course, the incorporation of the heat spreader in the molded resin package results in an increase in an entire thickness of the molded resin package, and this is contrary to the trend in which the thickness of resin-sealed type semiconductor devices should be made as small as possible. Although the entire thickness of the molded resin package can be reduced by thinning a skin layer of the molded resin package, this skin layer must have a thickness of more than 200 µm, before it is possible to prevent penetration of moisture into the molded resin package. Otherwise, wiring patterns, included in the molded resin package, are subjected to premature corrosion. Note, usually, the wiring patterns are made of aluminum.

In any event, conventionally, there are no proposals for reducing the entire thickness of the molded resin package without thinning the skin layer of the molded resin package.

SUMMARY OF THE INVENTION

Therefore, a main object of the present invention is to provide a resin-sealed type semiconductor device having an electronic component encapsulated in a molded resin package, and a heat spreader incorporated in the molded resin package to facilitate radiation of heat from the electronic component, wherein an entire thickness of the molded resin package can be reduced without thinning a skin layer of the molded resin package.

Another object of the present invention is to provide a production method for manufacturing such a resin-sealed-type semiconductor device.

In accordance with a first aspect of the present invention, there is provided a resin-sealed type semiconductor device, which comprises a mount stage, an electronic component mounted on the mount stage such that a rear surface of the electronic component is in contact with the mount stage, a heat spreader associated with the mount stage and the electronic component, and a molded resin package encapsulating the mount stage, the electronic component, and the heat spreader. The mount stage is configured such that the rear surface of the electronic component is partially covered with the mount stage, whereby uncovered areas are defined on the rear surface of the electronic component. On the other hand, the heat spreader is complementarily configured with respect to the mount stage so as to be in direct contact with the uncovered areas of the rear surface of the electronic component, whereby an entire thickness of both the mount stage and the heat spreader is smaller than a total of a thickness of the mount stage and a thickness of the heat spreader.

Preferably, the heat spreader includes respective plate sections which cover the uncovered areas on the rear surface of the electronic component. Each of the plate sections may be formed with a plurality of protrusions which are in direct contact with a corresponding uncovered area on the rear surface of the electronic component. Each of the plate sections may be further formed with a plurality of openings to thereby facilitate prevalence of resin in a molding cavity for the molded resin package. Also, two adjacent plate sections may be integrally joined to each other by a tie element at an outside of an area encompassed by the rear surface of the electronic component.

Preferably, the mount stage includes a center plate element, and elongated strip elements integrally and radially extending from the center plate element, and the definition of the uncovered areas on the rear surface of the electronic component is carried out by the center plate element and the elongated strip elements. In this case, each of the plate sections has a configuration which is substantially analogous to that of an area defined between two adjacent elongated strip elements.

When the molded resin package and the electronic component have a rectangular configuration, the elongated strip elements may integrally and radially extend through corners of the rectangular electronic component, and each of the uncovered areas may be defined as a generally isosceles triangular area on the rear surface of the electronic component by the center plate element and the elongated strip elements. In this case, each of the plate sections has a generally isosceles triangular configuration which is substantially analogous to a corresponding generally isosceles triangular area defined on the rear surface of the electronic component.

In any event, each of the plate sections may be formed with a plurality of protrusions which are in direct contact with a corresponding uncovered area on the rear surface of the electronic component. Also, each of the plate sections may be further formed with a plurality of openings to thereby facilitate prevalence of resin in a molding cavity for the molded resin package.

Two adjacent plate sections may be integrally joined to each other by a tie element at an outside of an area encompassed by the rear surface of the electronic component. Also, each of the tie elements may have a stem element extending outwardly therefrom, and the stem element is in contact with an end of a corresponding elongated strip element of the mount stage at the outside of the area encompassed by the rear surface of the electronic component.

When each of the plate sections has the generally isosceles triangular configuration, two apex portions of two adjacent isosceles triangular plate sections may be integrally joined to each other by a generally U-shaped tie element in the vicinity of a corresponding corner of the molded resin package at the outside of an area encompassed by the rear surface of the electronic component. Similarly, each of the U-shaped tie elements may have a stem element extending outwardly therefrom, and the stem element is in contact with an end of a corresponding elongated strip element of the mount stage at the outside of the area encompassed by the rear surface of the electronic component.

When the plate sections have a thickness thicker than that of the mount stage, the heat spreader may include a plate element on which the center plate element of the mount stage is placed. On the other hand, when each of the plate sections is formed with the plurality of protrusions, it may have a virtual thickness thicker than that of the mount stage due to the formation of the protrusions. In any event, preferably, the plate element is thinned so that a rear surface of the plate element is flush with a rear surface of the plate sections.

In accordance with a second aspect of the present invention, there is provided a production method for manufacturing a resin-sealed type semiconductor device, which method comprises the steps of: preparing a lead frame including a mount stage on which an electronic component is mounted such that a rear surface of the electronic component is in contact with the mount stage, the mount stage being configured such that the rear surface of the electronic component is partially covered with the mount stage, whereby uncovered areas are defined on the rear surface of the electronic component; preparing a heat-spreader frame including a heat spreader which is complementarily configured with respect to the mount stage; setting the heat-spreader frame with respect to a first mold die such that the heat spreader is positioned in place within a molding cavity half defined by the first mold die; setting the lead frame with respect to the first mold die, and placing it on the heat-spreader frame, such that the mount stage and the heat spreader 18 are complementarily associated with each other, whereby the heat spreader is in direct contact with the uncovered areas defined on the rear surface of the electronic component, with an entire thickness of both the mount stage and the heat spreader being smaller than a total of a thickness of the mount stage and a thickness of the heat spreader; mating a second mold die with the first mold die such that the molding cavity half is combined with a molding cavity half defined by the second mold die to thereby produce a complete molding cavity therebetween; introducing uncured resin into the complete molding cavity to produce a molded resin package encapsulating the mount stage, the semiconductor chip, and the heater spreader; removing the molded resin package together with the lead frame and the heat-spreader frame from the first and second mold dies after the molded resin package is completely cured; and trimming the lead frame and the heat-spreader frame such that the mount stage and the heat spreader are cut and separated from the lead frame and the heat-spreader frame, respectively.

In this production method, the heat spreader includes respective plate sections which cover the uncovered areas on the rear surface of the electronic component. Also, each of the plate sections is formed with a plurality of protrusions which are in direct contact with a corresponding uncovered area on the rear surface of the electronic component. Each of the plate sections may be further formed with a plurality of openings to thereby facilitate prevalence of the uncured resin in the complete molding cavity for the molded resin package.

BRIEF DESCRIPTION OF THE DRAWINGS

The above objects and other objects will be more clearly understood from the description set forth below, with reference to the accompanying drawings, wherein:

FIG. 1 is a plan view of a first embodiment of a resin-sealed type semiconductor device according to the present invention, which includes a molded resin package, and a plurality of leads projecting from the molded resin package;

FIG. 3 is a plan view of an arrangement of the leads and the mount stage included in the resin-sealed type semiconductor device shown in FIGS. 1, 2, and 3;

FIG. 4 is a plane view of a lead frame in which the leads and the mount stage shown in FIG. 3 are integrally incorporated therein;

FIG. 5 is a plan view of an arrangement of the leads, the mount stage, and the electronic component included in the resin-sealed type semiconductor device shown in FIGS. 1, 2A, and 2B;

FIG. 13 is a cross-sectional view, corresponding to FIG. 2A, showing a second embodiment of the resin-sealed type semiconductor device according to the present invention.

DESCRIPTION OF THE PREFERRED EMBODIMENTS

Figure 2A:
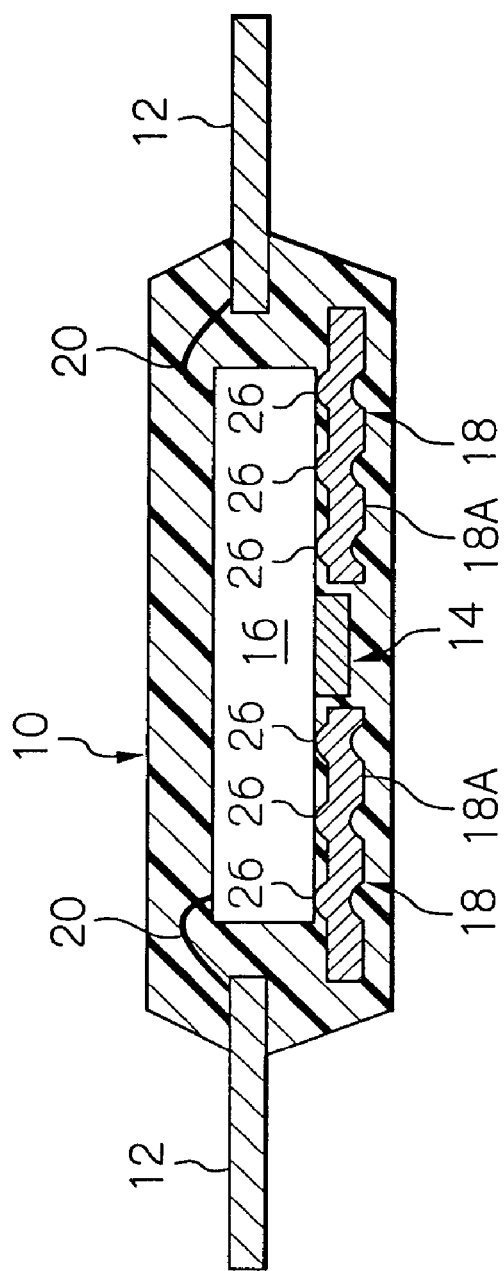
FIG. 2A is a cross-sectional view taken along the A—A line of FIG. 1, showing a mount stage, an electronic component, and a heat spreader encapsulated in the molded resin package.
Figure 2B:
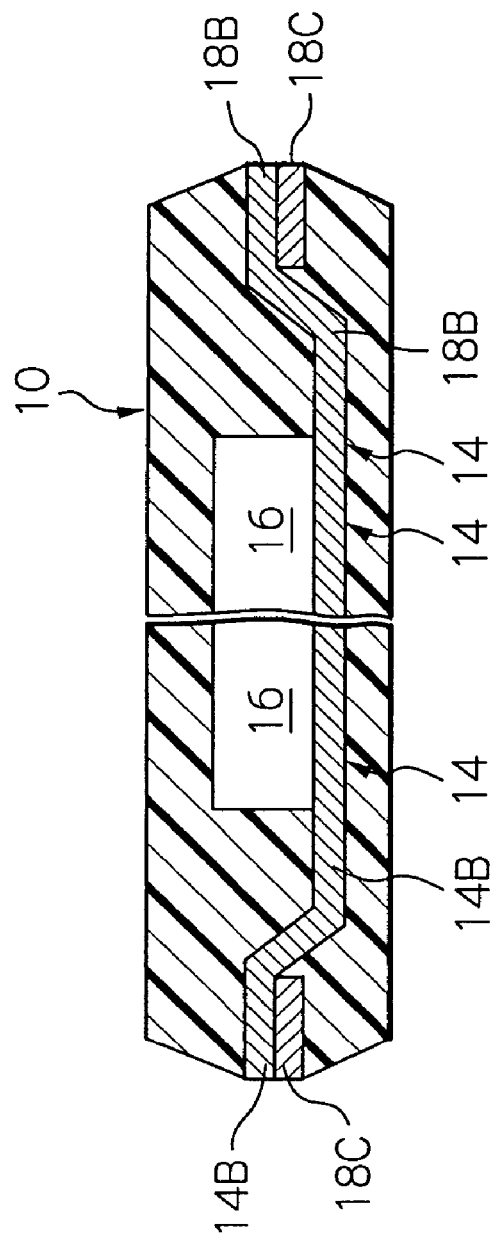
FIG. 2B is a cross-sectional view taken along the B—B line of FIG. 1.

First, with reference to FIG. 1, an embodiment of a resin-sealed type semiconductor device according to the present invention is illustrated in a plan view, and FIGS. 2A and 2B show respective cross sections of the resin-sealed type semiconductor device, taken along the A—A and B—B lines of FIG. 1.

As is apparent from FIG. 1, the resin-sealed type semiconductor device includes a molded resin package 10 having a rectangular configuration, and a plurality of leads 12 projecting from the sides of the molded resin package 10, and each of the leads 12 has an inner lead section buried in the molded resin package 10. As shown in FIGS. 2A and 2B, the resin-sealed type semiconductor device further includes a mount stage 14, an electronic component 16 mounted on the mount stage 14 so as to be in contact with a rear surface thereof, and a heat spreader 18 associated with the mount stage 12 and the electronic component 16, and the mount stage 14, the electronic component 16, and the heat spreader 18 are encapsulated in and sealed by the molded resin package 10.

In this embodiment, the electronic component 16 is formed as a rectangular semiconductor chip, and has a plurality of terminal pads, which are formed on a top surface of the semiconductor chip 16, and which are arranged along four sides of its top surface. As representatively shown in FIG. 2A, the inner lead section of each lead 12 is electrically connected to a corresponding terminal pad on the semiconductor chip 16 with a bonding-wire 20.

With reference to FIG. 3, an arrangement of the leads 12 and the mount stage 14 included in the molded resin package 10 is illustrated in a plan view. Note, in FIG. 3, a rectangular contour of the molded resin package 10 is represented by a double-dot chain line or phantom line PL.

As is apparent from FIG. 3, the leads 12 are divided into four groups of leads 12, and the leads 12 included in each group are arranged along a corresponding side of the molded resin package 10 represented by the phantom line PL. The mount stage 14 has a center circular plate element 14A, and four elongated strip elements 14B integrally and radially extending from the center circular plate element 14A to the respective corners of the molded resin package 10. As representatively shown in FIG. 2B, an outer end portion of each elongated strip element 14B is bent up and shaped so as to be exposed to the outside at the corresponding corner of the molded resin package 10.

As shown in FIG. 4, the leads 12 and the mount stage 14 are integrally incorporated in a lead frame LF when the resin-sealed type semiconductor device is produced. The lead frame LF is produced from a metal sheet, which is made of a suitable metal material, such as copper, copper alloy or the like, and which may have a thickness of at most 300 μm. In this embodiment, a setting of 200 μm is given to the thickness of the metal sheet, and thus the leads 12 and the mount stage 14 have a thickness which is equivalent to the thickness (200 μm) of the metal sheet.

As is apparent from FIG. 4, the lead frame LF has an outer frame section 22, the leads 12 included in each group integrally extend from a corresponding side of the outer frame section 22, and are integrated with a tie bar 24 laterally traversing them. As shown in FIG. 4, the four tie bars 24 are connected to each other at their ends to thereby define a rectangle, and each of the elongated strip elements 14B is integrally joined to a corresponding corner of that rectangle at its outer end. In short, the leads 12 and the mount stage 14 are supported by the outer frame section 22.

With reference to FIG. 5, an arrangement of the leads 12, the mount stage 14, and the semiconductor chip 16 included in the molded resin package 10 is illustrated in a plan view. Note, similar to FIG. 3, the rectangular contour of the molded resin package 10 is represented by the phantom line PL.

As shown in FIG. 5, the semiconductor chip 16 is mounted on and adhered to the mount stage 14 with a suitable bonding adhesive, and the respective inner lead sections of the leads 12 are electrically connected to the terminal pads (not shown) on the semiconductor chip 16 with the bonding-wires 20.

As is apparent from FIG. 5, the center circular plate element 14A has a considerably smaller area than that of the rear surface of the rectangular semiconductor chip 16, and each of the elongated strip elements 14B is very narrow. In particular, the center circular plate element 14A is placed at a center of the semiconductor chip 16, and the respective four elongated strip elements 14B extend through the corners of the rectangle of the semiconductor chip 16.

Thus, as shown in FIG. 5, the rear surface of the semiconductor chip 16 is not completely covered with the mount stage 14. In this embodiment, four uncovered areas are defined on the rear surface of the semiconductor chip 16 by the four elongated strip elements 14B radially extending from the center circular plate element 14A to the respective corners of the molded resin package 10, and each of the uncovered areas has a generally isosceles triangle which is substantially analogous to a corresponding one of four isosceles triangles which are defined in the rectangular contour (PL) by drawing the two diagonal lines thereof.

Figure 6:
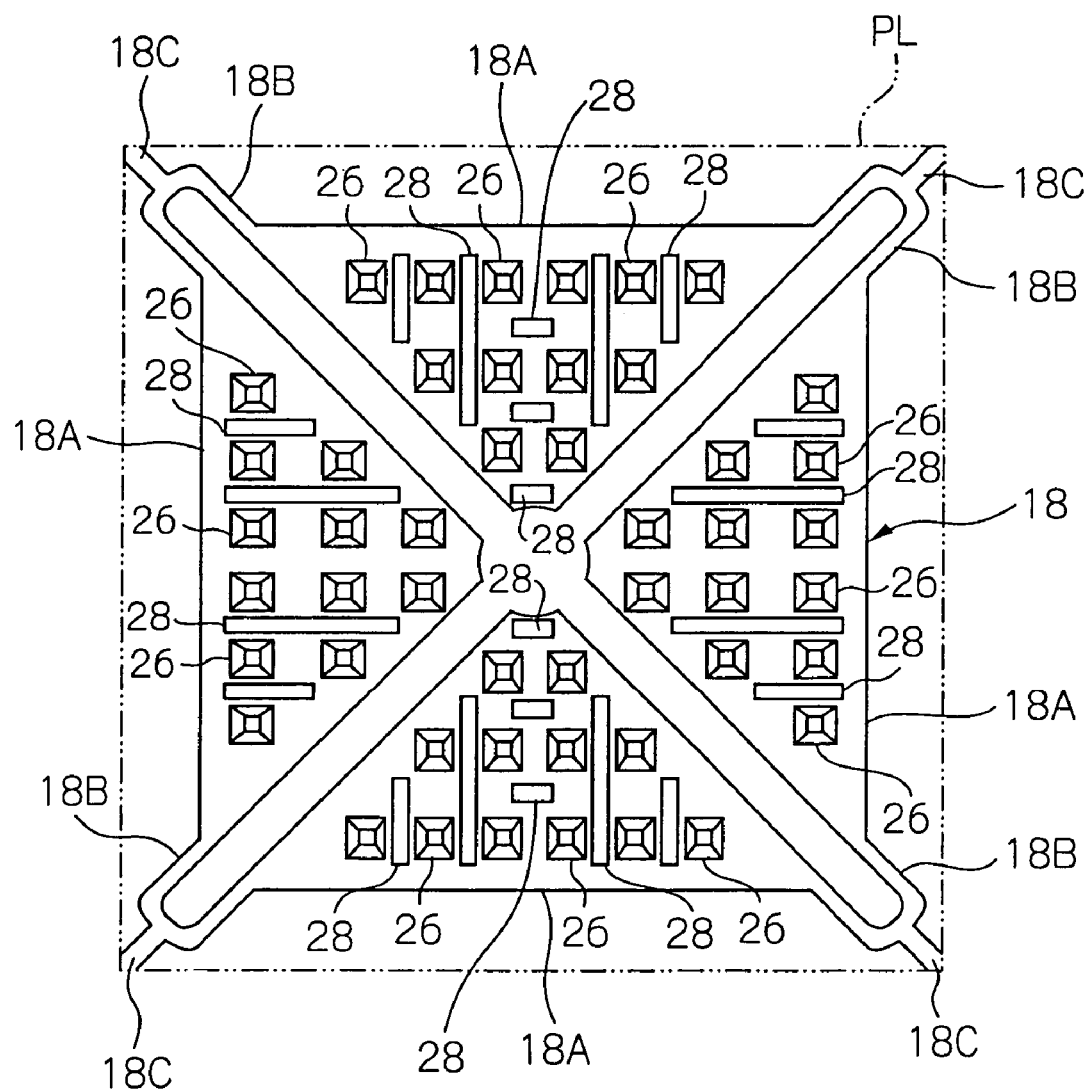
FIG. 6 is a plan view of the heat spreader included in the resin-sealed type semiconductor device shown in FIGS. 1, 2A, and 2B.

With reference to FIG. 6, the heat spreader 18 included in the molded resin package 10 is illustrated in a plan view. Note, similar to FIGS. 3 and 5, the rectangular contour of the molded resin package 10 is represented by the phantom line PL.

The heat spreader 18 has four plate sections 18A, each of which has a generally isosceles triangle which is analogous to a corresponding one of the uncovered isosceles triangular areas (FIG. 5) defined on the rear surface of the semiconductor chip 16. As shown in FIG. 6, each of the triangular plate sections 18A is formed with a plurality of protrusions 26, and a plurality of slit-like openings 28.

Also, the heat spreader 18 has four generally U-shaped tie elements 18B, which are disposed at the respective corners of the molded resin package 10, such that two apex portions of two adjacent triangular plate sections 18A are integrally joined to each other by a corresponding generally U-shaped tie element 18B in the vicinity of a corresponding one of the corners of the molded resin package 10. Namely, the joining of the triangular plate sections 18A to each other is carried out by the U-shaped tie element 18B at the outside of the area encompassed by the rear surface of the semiconductor chip 16. Each of the U-shaped tie elements 18B is provided with a stem element 18C integrally extending to a corresponding one of the corners of the molded resin package 10, and is bent up and shaped such that the stem element 18C is exposed to the outside at the corresponding corner of the molded resin package 10. Note, in the cross section of FIG. 2B, only the two diagonal stem elements 18C are visible.

Figure 7:
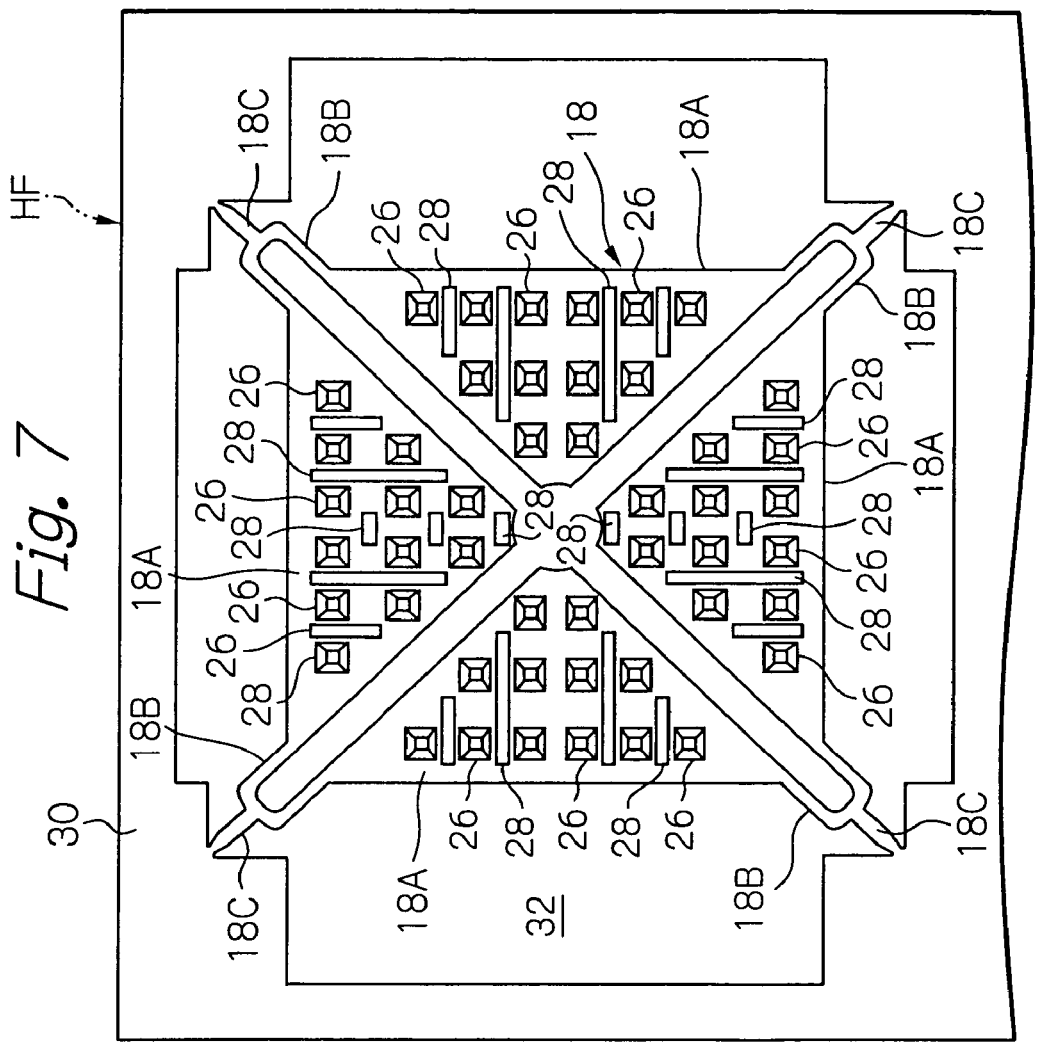
FIG. 7 is a plane view of a heat-spreader frame in which the heat spreader shown in FIG. 6 is integrally incorporated therein.

As shown in FIG. 7, the heat spreader 18 is integrally incorporated in a heat-spreader frame HF when the resin-sealed type semiconductor device is produced. The heat-spreader frame HF is produced from a metal sheet, which is formed of a suitable metal material exhibiting a good thermal conductivity, such as copper, copper alloy or the like, which may have a thickness of, for example, 125 to 150 μm. In this embodiment, a setting of 150 μm is given to the thickness of the metal sheet, and thus the heat spreader 18 has a thickness which is equivalent to the thickness (150 μm) of the metal sheet.

Nevertheless, each of the triangular plate sections 18A of the heat spreader 18 has a virtual thickness of more than 150 μm, because it has the plurality of protrusions 26 formed and arranged thereon. In particular, since the protrusions 26 may have a height of 50 to 100 μm, the virtual thickness of the triangular plate section 18A may have 175 to 250 μm. In this embodiment, a setting of 100 μm is given to the height of the protrusions 26, and thus each of the triangular plate sections 18A has the virtual thickness of 250 μm.

As is apparent from FIG. 7, the heat-spreader frame HF has an outer frame section 30, which is formed with an opening 32, and which has substantially the same size as that of the outer frame section 22 of the lead frame LF. The opening 32 is configured so as to encompass the four groups of leads 12 when the outer frame section 22 of the lead frame LF is placed on the outer frame section 30 of the heat-spreader frame HF such that the outer frame sections 22 and 30 are registered with each other. The heat-spreader 18 is disposed in the opening 32 such that the respective four stem elements 18C of the heat spreader 18 are integrally joined to the outer frame section 30, whereby the heat spreader 18 is supported by the outer frame section 30.

Figure 8:
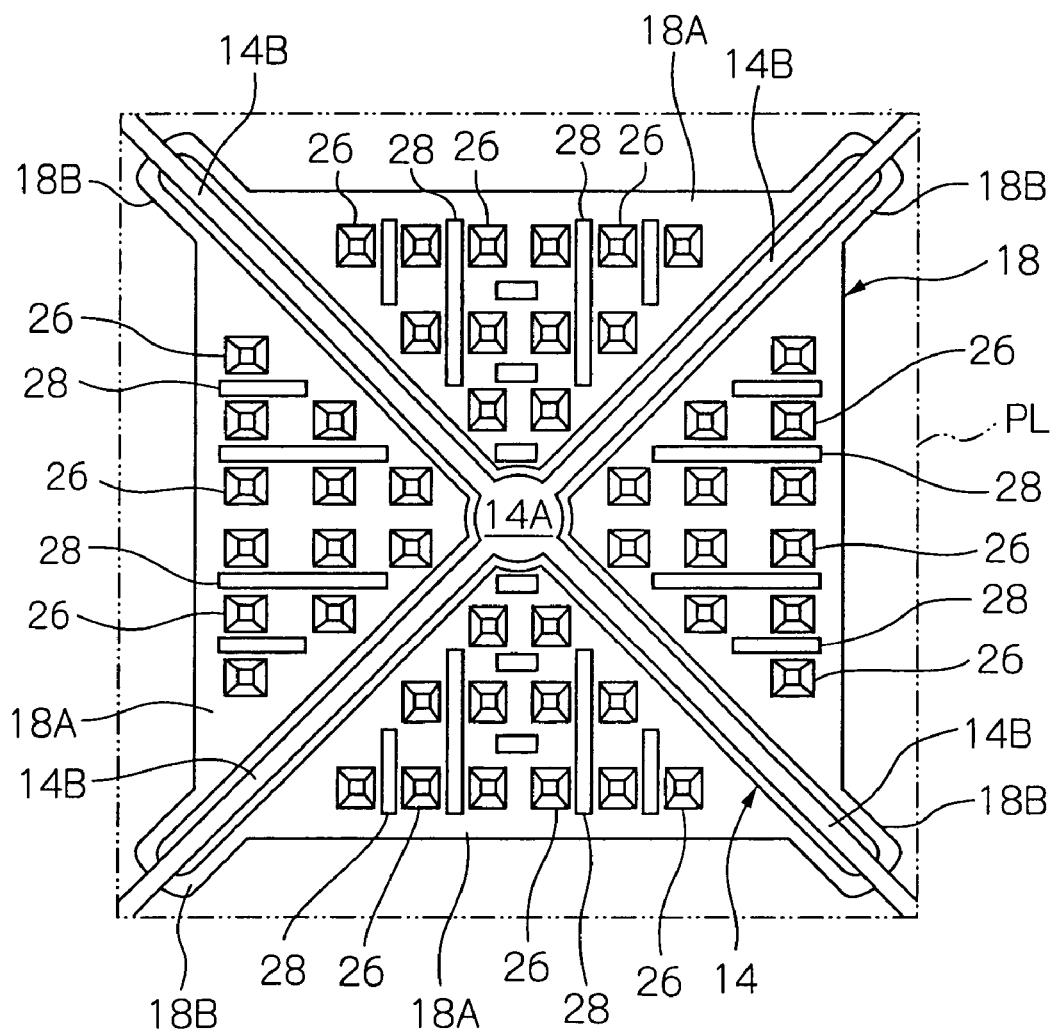
FIG. 8 is a plan view of an arrangement of the mount stage and the heat spreader included in the resin-sealed type semiconductor device shown in FIGS. 1, 2A, and 2B.

With reference to FIG. 8, an arrangement of the mount stage 14 and the heat spreader 18 included in the molded resin package 10 is illustrated in a plan view. Note, similar to FIGS. 3, 5 and 6, the rectangular contour of the molded resin package 10 is represented by the phantom line PL.

As is apparent from FIGS. 2B, 3, and 8, the mount stage 14 is placed on the heat spreader 18, but only the outer ends of the elongated strip elements 14B are in contact with the stem element 18C of the heat spreader 18. Namely, the respective triangular plate sections 18A are arranged in the generally isosceles triangular areas which are defined by the four elongated strip elements 14B, without being in contact with the center circular plate element 14A and the elongated strip elements 14B. In short, the mount stage 14 and the heat spreader 18 are complementarily configured with respect to each other such that the triangular plate sections or main sections 18A cannot overlap the mount stage 14. Thus, as shown in FIG. 2A, the protrusions 26 of each triangular plate section 18A are in direct contact with the rear surface of the semiconductor chip 16.

With the aforesaid arrangement of the mount stage 14 and heat spreader 18, while a part of heat, generated in the semiconductor chip 16, is transmitted to the heat spreader 18 through the stem elements 18C thereof which is in contact with the outer ends of the elongated strip elements 14B, the remaining part of heat directly escapes to the triangular plate sections 18A of the heat spreader 18. Namely, according to the present invention, while suppressing an increment in an entire thickness of the combined mount stage 14, semiconductor chip 16 and heat spreader 18, it is possible to efficiently eliminate the heat from the semiconductor chip 16.

In particular, conventionally, since a mount stage, on which a semiconductor chip is mounted, is placed on a heat spreader, an entire thickness of the combined mount stage, semiconductor chip and heat spreader is equivalent to a total of respective thicknesses of the mount stage, semiconductor chip and heat spreader, as disclosed in the aforesaid Japanese Laid-Open Patent Publications (KOKAI) No. 2000-294712 and No. 2001-156235. On the contrary, according to the present invention, an entire thickness of the combined mount stage 14, semiconductor chip 16 and heat spreader 18 is smaller than a total of respective thicknesses of the mount stage 14, semiconductor chip 16 and heat spreader 18, because the mount stage 14 and the heat spreader 18 are complementarily associated with each other such that the triangular plate sections 18A cannot overlap the mount stage 14.

Thus, a setting of at least 200 μm can be given to a thickness of a skin layer of the molded resin package 10 covering the rear side of the semiconductor chip 16, with which the mount stage 14 and the heat spreader 18 are associated, without an undesirable increment in an entire thickness of the molded resin package 10. As a result, it is possible to prevent penetration of moisture into the molded resin package 10, whereby aluminum wiring patterns, included in the molded resin package 10, can be protected from being subjected to premature corrosion.

Figure 9A:
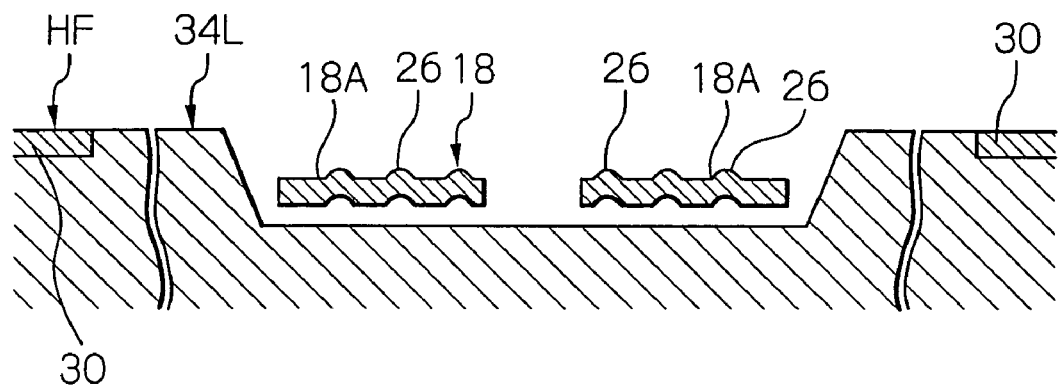
FIG. 9A is a cross-sectional view, corresponding to FIG. 2A, showing a first representative step of a production method for manufacturing the resin-sealed type semiconductor device shown in FIGS. 1, 2A, and 2B.
Figure 9B:
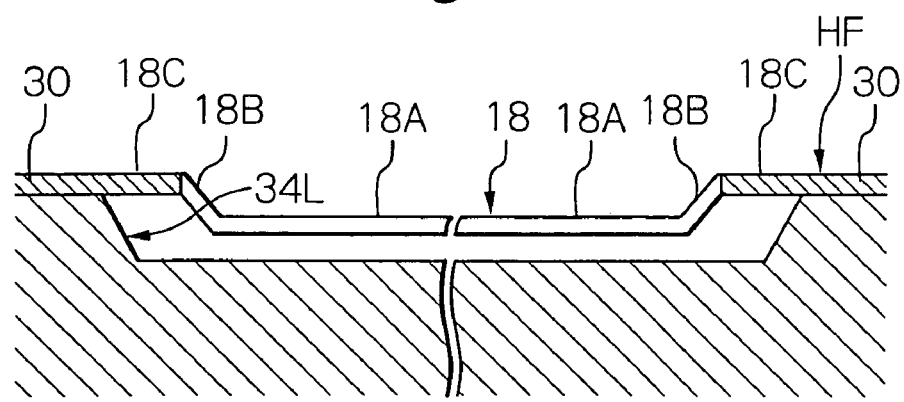
FIG. 9B is a cross-sectional view, corresponding to FIG. 2B, showing the same first representative step of the production method as in FIG. 9A.

Referring to FIGS. 9A and 9B; 10A and 10B, 11A and 11B; and 12A and 12B, a production method for manufacturing the aforesaid resin-sealed type semiconductor device is illustrated.

Note, although the production method includes a mounting process for mounting the semiconductor chip 16 on the mount stage 14 of the lead frame LF, and a bonding process for electrically connecting the respective leads 12 to the terminal pads formed on the top surface of the semiconductor chip 16, the mounting process and the bonding process have been already completed. Also, note, in this production method, a pair of lower and upper metal mold dies 34L and 34U are used to mold the resin package 10, as shown in FIGS. 11A and 11B; and FIGS. 12A and 12B.

First, as shown in FIGS. 9A and 9B, the lower metal mold die 34L is prepared, and the heat-spreader frame HF is set with respect to the lower metal mold die 34L such that the heat spreader 18 is positioned in place within a molding cavity half defined in the lower metal mold die 34L. In this base, the triangular plate sections 18A are spaced from the bottom of the molding cavity half of the lower metal mold die 34L, by a distance of at least 200 μm.

Figure 10A:
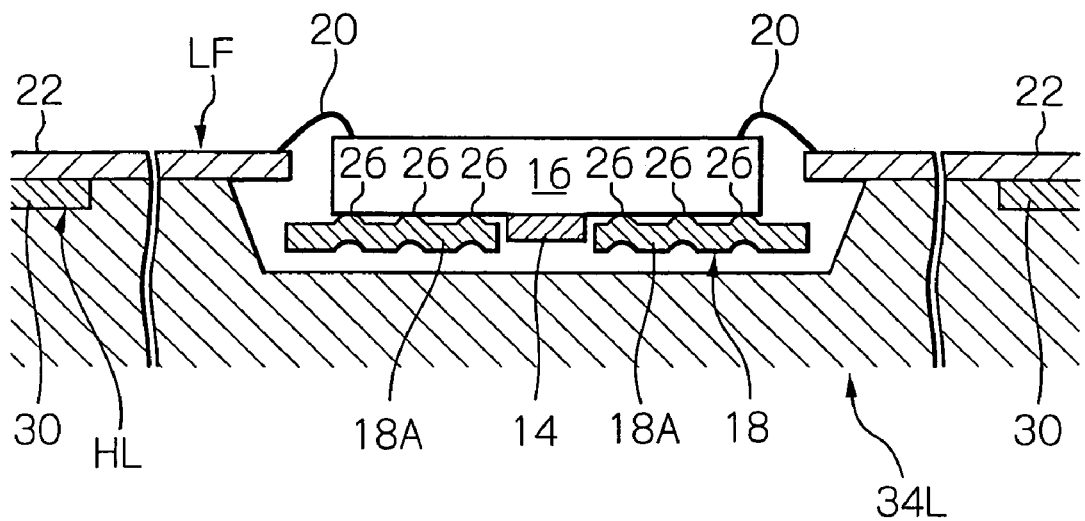
FIG. 10A is a cross-sectional view, corresponding to FIG. 2A, showing a second representative step of the production method for manufacturing the resin-sealed type semiconductor device.
Figure 10B:
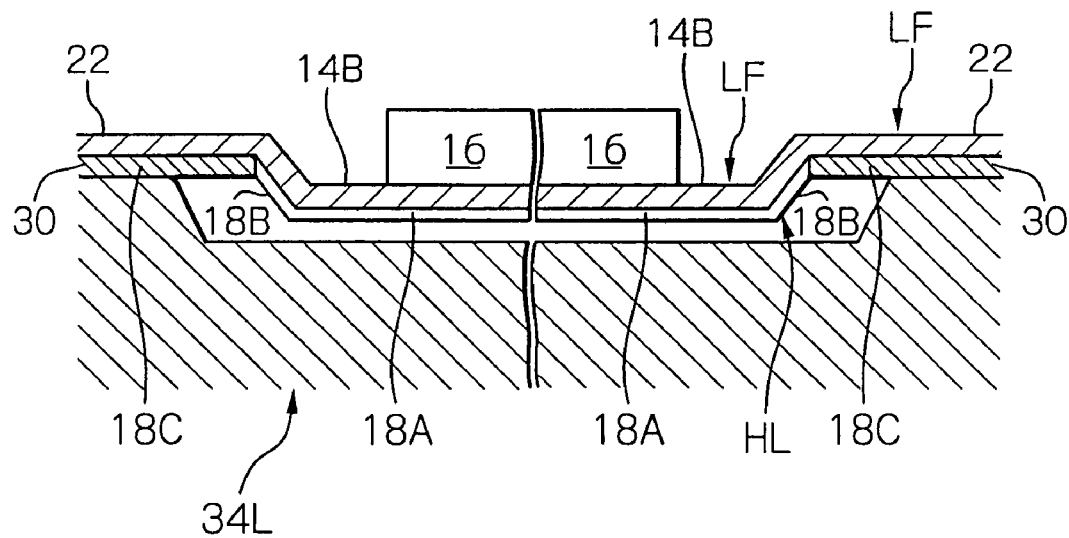
FIG. 10B is a cross-sectional view, corresponding to FIG. 2B, showing the same second representative step of the production method as in FIG. 10A.

Then, as shown in FIGS. 10A and 10B, the lead frame LF, having the wire-bonded semiconductor chip 16 mounted on the mount stage 14, is with respect to the lower metal mold die 34L, and is placed on the heat-spreader frame HF, such that the outer frame sections 22 and 30 are registered with each other, whereby the mount stage 14 and the heat spreader 18 are complementarily associated with each other such that the triangular plate sections 18A cannot overlap the mount stage 14, as best shown in FIG. 8. Thus, the protrusions 26 of each of the triangular plate sections 18A are in direct contact with a corresponding generally-triangular uncovered area of the rear surface of the semiconductor chip 16 which are defined by two adjacent elongated strip elements 14B, as best shown in FIG. 10A.

Figure 11A:
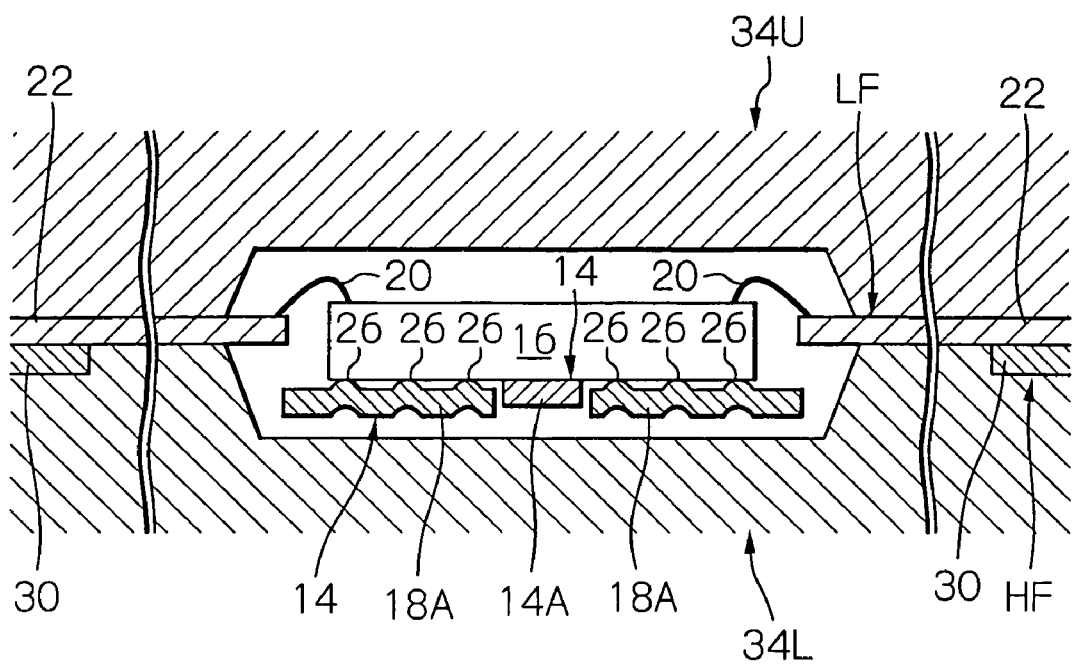
FIG. 11A is a cross-sectional view, corresponding to FIG. 2A, showing a third representative step of the production method for manufacturing the resin-sealed type semiconductor device.
Figure 11B:
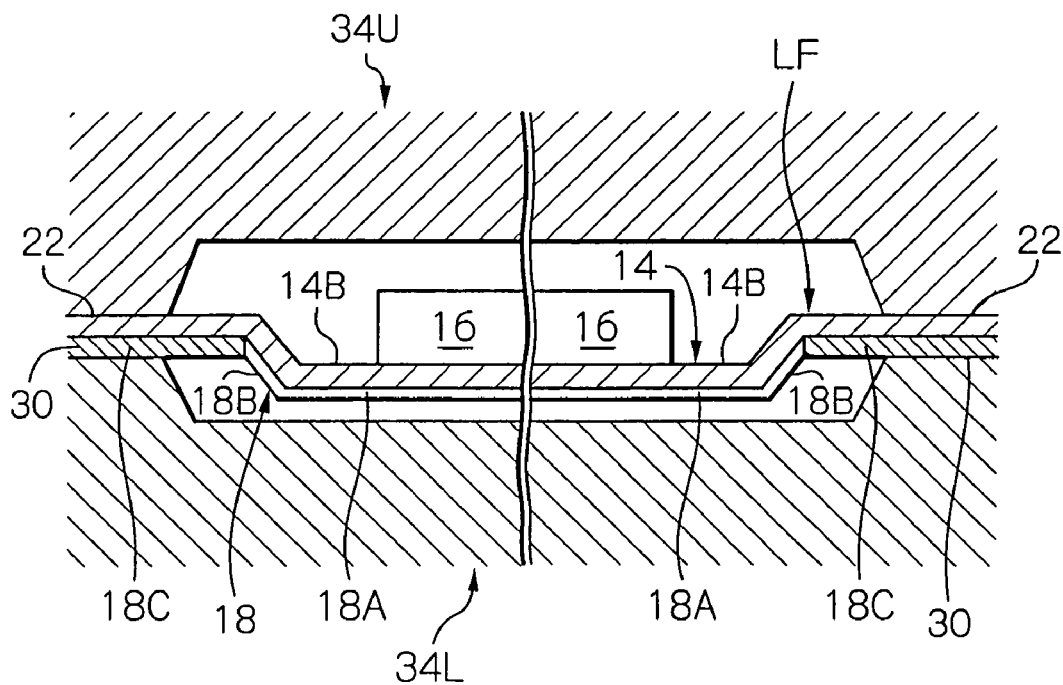
FIG. 11B is a cross-sectional view, corresponding to FIG. 2B, showing the same third representative step of the production method as in FIG. 11A.
Figure 12A:
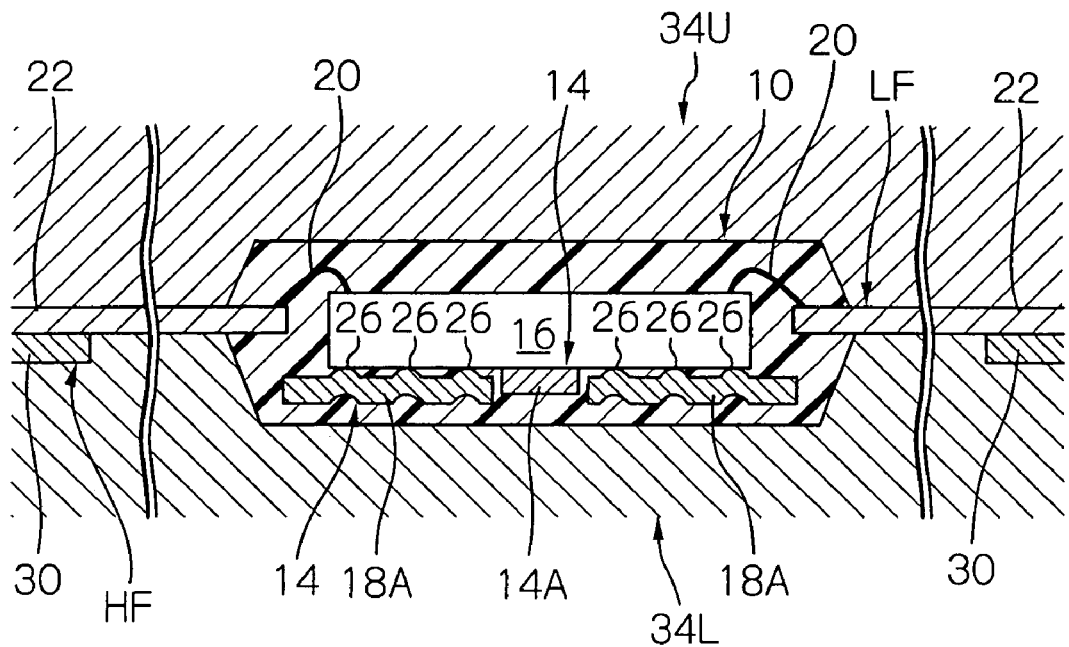
FIG. 12A is a cross-sectional view, corresponding to FIG. 2A, showing a fourth representative step of the production method for manufacturing the resin-sealed type semiconductor device.
Figure 12B:
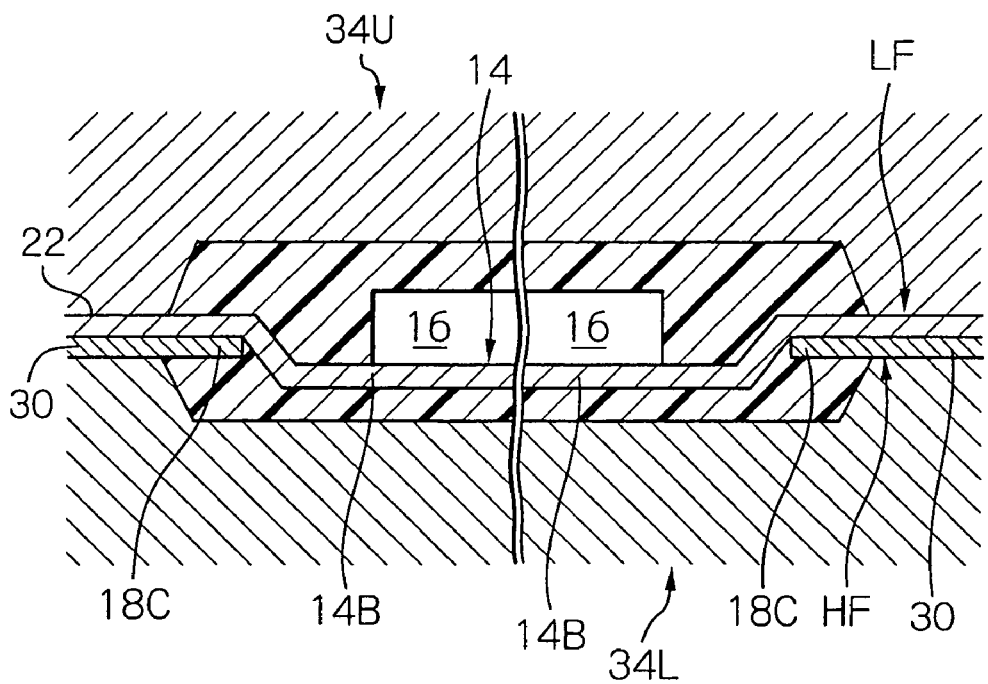
FIG. 12B is a cross-sectional view, corresponding to FIG. 2B, showing the same fourth representative step of the production method as in FIG. 12A.

Subsequently, as shown in FIGS. 11A and 11B, the upper metal mold die 34U is mated with the lower metal mold die 34L so as to define a complete molding cavity therebetween for molding the resin package 10. Thereafter, suitable uncured resin, such as epoxy, is introduced into the molding cavity through an inlet passage formed in either of the lower metal mold die 34L or the upper metal mold die 34U, whereby the inner lead sections of the leads 12, the mount stage 14, the semiconductor chip 16 with the bonding wires 20, and the heater spreader 18 are enclosed with and encapsulated in the molded resin package 10, with the outer lead sections of the leads 12 being protruded from the molded resin package 10, as shown in FIGS. 12A and 12B.

In this molding process, it is possible to facilitate prevalence of the introduced resin in the molding cavity, due to the plurality of slit-like openings 28 formed in the triangular plate sections 18A. Namely, the formation of the slit-like openings 28 contribute to prevention of production of voids in the molded resin package 10 because of the facilitation of the prevalence of the introduced resin in the molding cavity. Note, each of the slit-like openings 28 may have a width of 100 to 1000 μm, and a length of 1 to 10 mm.

After the molded resin package 10 is completely cured, the resin package 10 is removed from the pair of metal mold halves 34L and 34U, both the lead frame LF and the heat-spreader frame HF are subjected to a trimming process. Namely, the leads 12 and the mount stage 14 are cut and separated from the lead frame LF, and the heat spreader 18 is cut and separated from the heat-spreader frame HF, resulting in the production of the resin-sealed type semiconductor device as shown in FIGS. 1, 2A and 2B. Note, in this trimming process, the tie bars 24 are simultaneously cut away so that the leads 12 are separated from each other.

Figure 14:
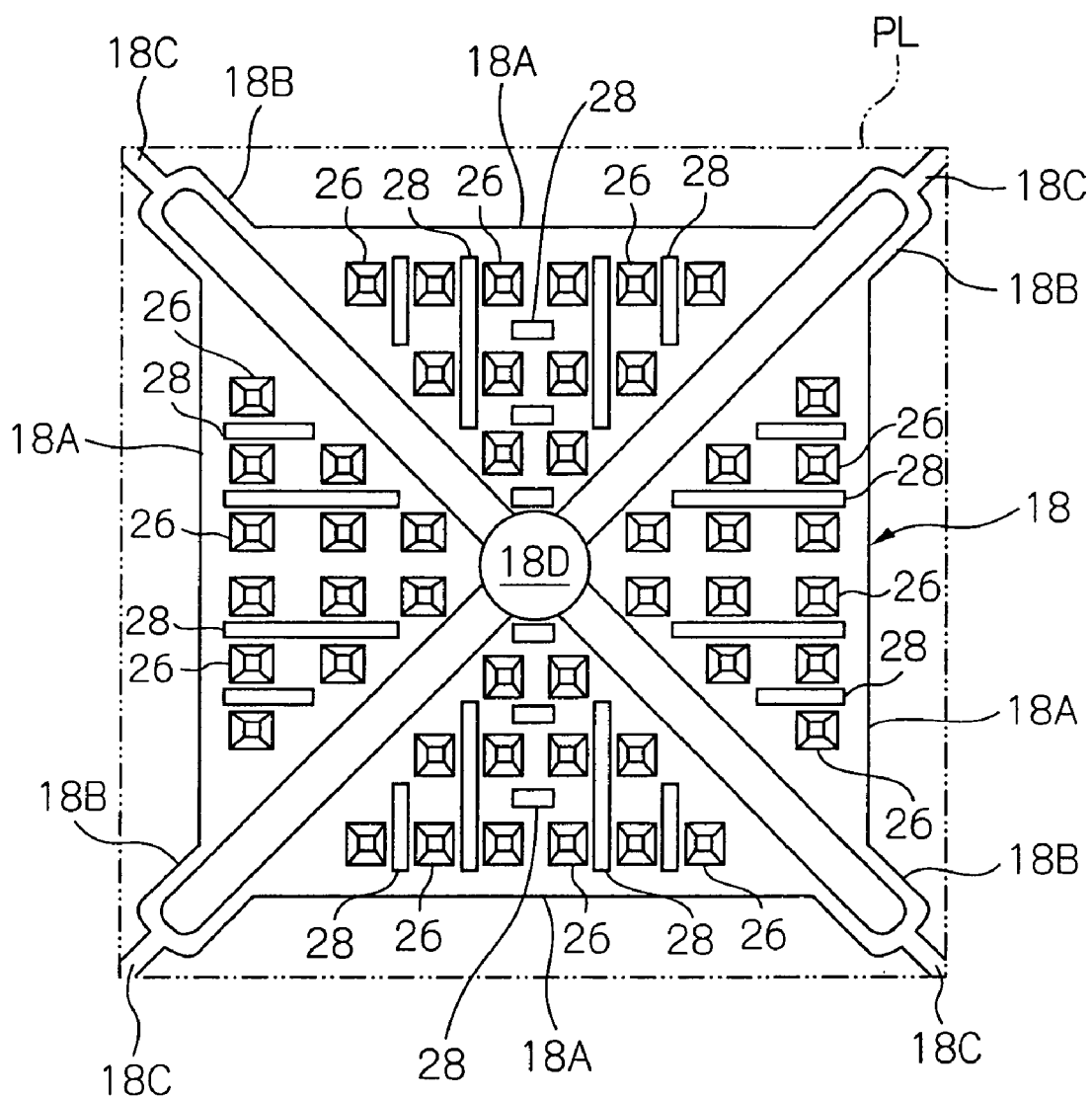
FIG. 14 is a plan view, corresponding to FIG. 6, showing a heat spreader included in the second embodiment of the resin-sealed type semiconductor device shown in FIG. 12.

With reference to FIGS. 13 and 14 corresponding to FIGS. 2A and 6, a second embodiment of the resin-sealed type semiconductor device according to the present invention is shown. Note, in FIGS. 13 and 14, the features similar to those of FIGS. 2A and 6 are indicated by the same references.

As shown in these drawings, the heat spreader 18 has a small thin circular plate element 18D which is disposed at a center thereof, such that the center circular plate element. 14 is placed on the small thin circular plate element 18D. In particular, as best shown in FIG. 14, an apex of each triangular plate section 18A is shaped as an inward-recessed arch such that a circular space is defined by the inward-recessed arches at the center of the heat spreader 18, and the small thin circular plate element 18D is arranged so as to occupy the circular space.

In this second embodiment, the circular plate element 18D is formed as a separate part made of a suitable metal material, and is adhered to the inward-recessed arches of the triangular plate section 18A, using a suitable adhesive agent having a good thermal conductivity. Also, although the circular plate element 18D may have a thickness of 50 to 70 μm, preferably, the circular plate element 18D is thinned so that the rear surface of the circular plate element 18D is flush with the rear surface of the triangular plate sections 18A. Namely, in this embodiment, it is preferable to give a setting of 50 μm to the thickness of the circular plate element 18D.

Thus, according to the second embodiment, it is possible to more effectively allow the heat to escape from the semiconductor chip 16 to the heat spreader 18, due to the existence of the circular plate element 18D, in comparison with the aforesaid first embodiment.

In the second embodiment, although the circular plate element 18D is formed as a separate part, it may be integrally incorporated in a heat-spreader frame HF as shown in FIG. 7. In this case, the heat-spreader frame HF is subjected to a pressing process in which the thickness of the circular plate element 18D is reduced, whereby the rear surface of the circular plate element 18D is flush with the rear surface of the isosceles-triangular plate sections 18A.

Finally, it will be understood by those skilled in the art that the foregoing description is of preferred embodiments of the devices and processes, and that various changes and modifications may be made to the present invention without departing from the spirit and scope thereof.

What is claimed is:

1. A resin-sealed type semiconductor device which comprises:
   a mount stage that is formed with a center plate element;
   an electronic component mounted on said mount stage such that the center plate element of said mount stage is placed at a center of a rear surface of said electronic component, the center plate element of said mount stage having a smaller area than that of the rear surface of said semiconductor component so that uncovered areas are defined on the rear surface of said electronic component;
   a heat spreader associated with said mount stage and said electronic component; and
   a molded resin package encapsulating said mount stage, said electronic component, and said heat spreader,
   wherein said heat spreader is complementarily configured with respect to said mount stage so as to be in direct contact with the uncovered areas of the rear surface of said electronic component.

2. A resin-sealed type semiconductor device as set forth in claim 1, wherein said heat spreader includes respective plate sections which cover the uncovered areas on the rear surface of said electronic component.

3. A resin-sealed type semiconductor device as set forth in claim 2, wherein each of said plate sections is formed with a plurality of protrusions which are in direct contact with a corresponding uncovered area on the rear surface of said electronic component.

4. A resin-sealed type semiconductor device as set forth in claim 3, wherein each of said plate sections is further formed with a plurality of openings to thereby facilitate prevalence of resin in a molding cavity for said molded resin package.

5. A resin-sealed type semiconductor device as set forth in claim 2, wherein two adjacent plate sections are integrally joined to each other by a tie element at an outside of an area encompassed by the rear surface of said electronic component.

6. A resin-sealed type semiconductor device as set forth in claim 2, wherein the mount stage includes elongated strip elements integrally and radially extending from the center plate element thereof, the definition of said uncovered areas on the rear surface of said electronic component being carried out by said center plate element and said elongated strip elements.

7. A resin-sealed type semiconductor device as set forth in claim 6, wherein each of said plate sections has a configuration which is substantially analogous to that of an area defined between two adjacent elongated strip elements.

8. A resin-sealed type semiconductor device as set forth in claim 7, wherein each of said plate sections is further formed with a plurality of openings to thereby facilitate prevalence of resin in a molding cavity for said molded resin package.

9. A resin-sealed type semiconductor device as set forth in claim 6, wherein each of said plate sections is formed with a plurality of protrusions which are in direct contact with a corresponding uncovered area on the rear surface of said electronic component.

10. A resin-sealed type semiconductor device as set forth in claim 9, wherein said plate sections have a virtual thickness thicker than that of said mount stage due to the formation of the protrusions, and said heat spreader includes a plate element on which the center plate element of said mount stage is placed.

11. A resin-sealed type semiconductor device as set forth in claim 10, wherein said plate element is thinned so that a rear surface of said plate element is flush with a rear surface of said plate sections.

12. A resin-sealed type semiconductor device as set forth in claim 6, wherein two adjacent plate sections are integrally joined to each other by a tie element at an outside of an area encompassed by the rear surface of said electronic component.

13. A resin-sealed type semiconductor device as set forth in claim 12, wherein each of said tie elements has a stem element outward extending therefrom, and said stem element is in contact with an end of a corresponding elongated strip element of said mount stage at the outside of said area encompassed by the rear surface of said electronic component.

14. A resin-sealed type semiconductor device as set forth in claim 6, wherein said plate sections have a thickness thicker than that of said mount stage, and said heat spreader includes a plate element on which the center plate element of said mount stage is placed.

15. A resin-sealed type semiconductor device as set forth in claim 14, wherein said plate element is thinned so that a rear surface of said plate element is flush with a rear surface of said plate sections.

16. A resin-sealed type semiconductor device as set forth in claim 6, wherein said isosceles triangular plate sections have a thickness thicker than that of said mount stage, and said heat spreader includes a plate element on which the center plate element of said mount stage is placed.

17. A resin-sealed type semiconductor device as set forth in claim 16, wherein said plate element is thinned so that a rear surface of said plate element is flush with a rear surface of said isosceles triangular plate sections.

18. A resin-sealed type semiconductor device as set forth in claim 2, wherein said molded resin package and said electronic component have a rectangular configuration, the mount stage including four elongated strip elements integrally and radially extending from the center plate element to corners of said rectangular electronic component, each of said uncovered areas being defined as a generally isosceles triangular area on the rear surface of said electronic component by said center plate element and said elongated strip elements.

19. A resin-sealed type semiconductor device as set forth in claim 18, wherein each of said generally isosceles triangular plate sections is formed with a plurality of protrusions which are in direct contact with a corresponding generally isosceles triangular area on the rear surface of said electronic component.

20. A resin-sealed type semiconductor device as set forth in claim 19, wherein said isosceles triangular plate sections have a virtual thickness thicker than that of said mount stage due to the formation of the protrusions, and said heat spreader includes a plate element on which the center plate element of said mount stage is placed.

21. A resin-sealed type semiconductor device as set forth in claim 20, wherein said plate element is thinned so that a rear surface of said plate element is flush with a rear surface of said isosceles triangular plate sections.

22. A resin-sealed type semiconductor device as set forth in claim 18, wherein each of said plate sections has a generally isosceles triangular configuration which is substantially analogous to a corresponding generally isosceles triangular area defined on the rear surface of said electronic component.

23. A resin-sealed type semiconductor device as set forth in claim 22, wherein each of said generally isosceles triangular plate sections is further formed with a plurality of openings to thereby facilitate prevalence of resin in a molding cavity for said molded resin package.

24. A resin-sealed type semiconductor device as set forth in claim 18, wherein two apex portions of two adjacent isosceles triangular plate sections are integrally joined to each other by a generally U-shaped tie element in the vicinity of a corresponding corner of said molded resin package at an outside of an area encompassed by the rear surface of said electronic component.

25. A resin-sealed type semiconductor device as set forth in claim 24, wherein each of said U-shaped tie elements has a stem element extending outwardly therefrom, and said stem element is in contact with an end of a corresponding elongated strip element of said mount stage at the outside of said area encompassed by the rear surface of said electronic component.

26. A resin-sealed type semiconductor device as set forth in claim 1, wherein said heat spreader is completely encapsulated in and covered with said molded resin package.

27. A resin-sealed type semiconductor device as set forth in claim 1, wherein the uncovered areas are discretely arranged around the central plate element of said mount stage, said heat spreader including respective plate sections which cover the uncovered area on the rear surface of said electronic component.

28. A resin-sealed type semiconductor device as set forth in claim 1, wherein the uncovered areas are discretely arranged around the central plate element of said mount stage, said heat spreader including respective plate sections which cover the uncovered area on the rear surface of said electronic component, and a plate element on which the center plate element of said mount stage is placed, said plate sections having a thickness thicker than that of the plate element of said heat spreader.

29. A production method for manufacturing a resin-sealed type semiconductor device, which method comprises:
preparing a lead frame including a mount stage on which an electronic component is mounted such that a rear surface of said electronic component is in contact with said mount stage, said mount stage being configured such that the rear surface of said electronic component is partially covered with said mount stage, whereby uncovered areas are defined on the rear surface of said electronic component;
preparing a heat-spreader frame including a heat spreader which is complementarily configured with respect to said mount stage;

setting said heat-spreader frame with respect to a first mold die such that said heat spreader is positioned in place within a molding cavity half defined by said first mold die;

setting said lead frame with respect to said first mold die, and placing it on said heat-spreader frame, such that said mount stage and said heat spreader are complementarily associated with each other, whereby said heat spreader is in direct contact with the uncovered areas defined on the rear surface of said electronic component, with an entire thickness of both said mount stage and said heat spreader being smaller than a total of a thickness of said mount stage and a thickness of said heat spreader;

mating a second mold die with said first mold die such that the molding cavity half is combined with a molding cavity half defined by said second mold die to thereby produce a complete molding cavity therebetween;

introducing uncured resin into said complete molding cavity to produce a molded resin package encapsulating said mount stage, said semiconductor chip, and the heater spreader;

removing said molded resin package together with said lead frame and said heat-spreader frame from said first and second mold dies after said molded resin package is completely cured; and trimming said lead frame and said heat-spreader frame such that said mount stage and said heat spreader are cut and separated from said lead frame and said heat-spreader frame, respectively.

30. A production method as set forth in claim 29, wherein said heat spreader includes respective plate sections which cover the uncovered areas on the rear surface of said electronic component.

31. A production method as set forth in claim 30, wherein each of said plate sections is formed with a plurality of protrusions which are in direct contact with a corresponding uncovered area on the rear surface of said electronic component.

32. A production method as set forth in claim 31, wherein each of said plate sections is further formed with a plurality of openings to thereby facilitate prevalence of the uncured resin in said complete molding cavity for said molded resin package.

33. A resin-sealed type semiconductor device which comprises:

a mount stage that is formed with a center plate element;

an electronic component mounted on said mount stage such that the center plate element of said mount stage is placed at a center of a rear surface of said electronic component, the center plate element of said mount stage having a smaller area than that of the rear surface of said semiconductor component so that uncovered areas are defined on the rear surface of said electronic component;

a heat spreader associated with said mount stage and said electronic component; and a molded resin package encapsulating said mount stage, said electronic component, and said heat spreader, wherein said heat spreader is complementarily configured with respect to said mount stage so as to be in direct contact with the uncovered areas of the rear surface of said electronic component, whereby an entire thickness of both the mount stage and a thickness of said heat spreader is smaller than a total of a thickness of said mount stage and a thickness of said heat spreader.

34. A resin-sealed type semiconductor device which comprises:

a mount stage that is formed with a center plate element;

an electronic component mounted on said mount stage such that the center plate element of said mount stage is placed at a center of a rear surface of said electronic component, the center plate element of said mount stage having a smaller area than that of the rear surface of said semiconductor component so that uncovered areas are defined on the rear surface of said electronic component;

a heat spreader associated with said mount stage and said electronic component and having a plurality of protrusions formed and arranged thereon; and a molded resin package encapsulating said mount stage, said electronic component, and said heat spreader, wherein said heat spreader is complementarily configured with respect to said mount stage such that the protrusions of said heat spreader are in direct contact with the uncovered areas of the rear surface of said electronic component.

* * * * *

UNITED STATES PATENT AND TRADEMARK OFFICE
CERTIFICATE OF CORRECTION

PATENT NO.         : 7,030,505 B2
APPLICATION NO. : 10/701619
DATED              : April 18, 2006
INVENTOR(S)        : Naoto Kimura It is certified that error appears in the above-identified patent and that said Letters Patent is hereby corrected as shown below:

Column 5, line 38, delete "12", insert -- 14 --

Column 9, lines 15, 19, 34 and 40, delete "12", insert -- 22 --

Signed and Sealed this

Twenty-fourth Day of November, 2009

David J. Kappos
*Director of the United States Patent and Trademark Office*